(12) United States Patent
Carinci et al.

(10) Patent No.: US 10,670,681 B2
(45) Date of Patent: Jun. 2, 2020

(54) MAGNETIC RESONANCE APPARATUS AND METHOD FOR PARALLEL IMAGING WITH A REFERENCE DATA SET FOR DETERMINING THE WEIGHTING MATRIX

(71) Applicant: Siemens Healthcare GmbH, Erlangen (DE)

(72) Inventors: Flavio Carinci, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 134 days.

(21) Appl. No.: 15/903,509

(22) Filed: Feb. 23, 2018

(65) Prior Publication Data

US 2018/0246182 A1    Aug. 30, 2018

(30) Foreign Application Priority Data

Feb. 24, 2017    (DE) .................. 10 2017 203 082

(51) Int. Cl.
*G01R 33/561* (2006.01)
*G01R 33/565* (2006.01)
*G01R 33/54* (2006.01)

(52) U.S. Cl.
CPC ........ *G01R 33/5611* (2013.01); *G01R 33/543* (2013.01); *G01R 33/565* (2013.01)

(58) Field of Classification Search
None
See application file for complete search history.

(56) References Cited

U.S. PATENT DOCUMENTS

| 2008/0303521 | A1 | 12/2008 | Beatty et al. |
| 2009/0093709 | A1 | 4/2009 | Patel et al. |
| 2010/0303320 | A1 | 12/2010 | Roemer et al. |
| 2016/0231409 | A1 | 8/2016 | Taviani et al. |

(Continued)

OTHER PUBLICATIONS

Gonçalves, Hugo. Aliasing, http://www.onmyphd.com/?p=aliasing. (Year: 2014).*

(Continued)

*Primary Examiner* — Justin P. Misleh
(74) *Attorney, Agent, or Firm* — Schiff Hardin LLP

(57) ABSTRACT

In a magnetic resonance apparatus and a method for generating MR image data of a subject with parallel imaging, a reference data set of the object is recorded, in which at least one partial section of the associated raw data space is completely filled with raw data according to the Nyquist condition, and an imaging data set is recorded for the generation of the MR image data on the basis of spin-echo-based signals, in which the associated raw data space is not completely recorded according to the Nyquist condition. A weighting matrix is calculated based on the reference data set, which is used to determine raw data points of the imaging data set not recorded during parallel imaging. The unrecorded raw data points of the imaging data set are calculated using the calculated weighting matrix. The reference data set is recorded with a spin-echo-based reference imaging sequence without segmentation within an imaging slice and without temporal overlap with the recording of the imaging data set, and a resolution is used in the readout direction which is lower by at least a factor of 4 than when the imaging data set is recorded.

11 Claims, 4 Drawing Sheets

(56) References Cited

U.S. PATENT DOCUMENTS

2017/0322280 A1 11/2017 Carinci et al.
2018/0120402 A1* 5/2018 Nehrke ............... G01R 33/243

OTHER PUBLICATIONS

Griswold MA, Jakob PM, Heidemann RM, et al. Generalized autocalibrating partially parallel acquisitions (GRAPPA). Magn Reson Med. 2002;47:1202-1210 (Year: 2002).*
C.A. Baron, C. Beaulieu Motion robust GRAPPA for echo-planar imagingMagn. Reson. Med., 75 (2016), pp. 1166-1174. (Year: 2016).*
Hennig J, Weigel M, Scheffler K. Multiecho sequences with variable refocussing flip angles: optimization of signal behavior using smooth transition between pseudo steady states (TRAPS). Magn Reson Med. 2003;49:527-535. (Year: 2003).*
Pruessmann, et al. "SENSE: Sensitivity Encoding for Fast MRI" Magnetic Resonance in Medicine, vol. 42, No. 5, pp. 952-962, (1999).
Lin, et al. "Functional MRI Using Regularized Parallel Imaging Acquisition" Magnetic Resonance in Medicine, vol. 54, pp. 343-353, (2005).

* cited by examiner

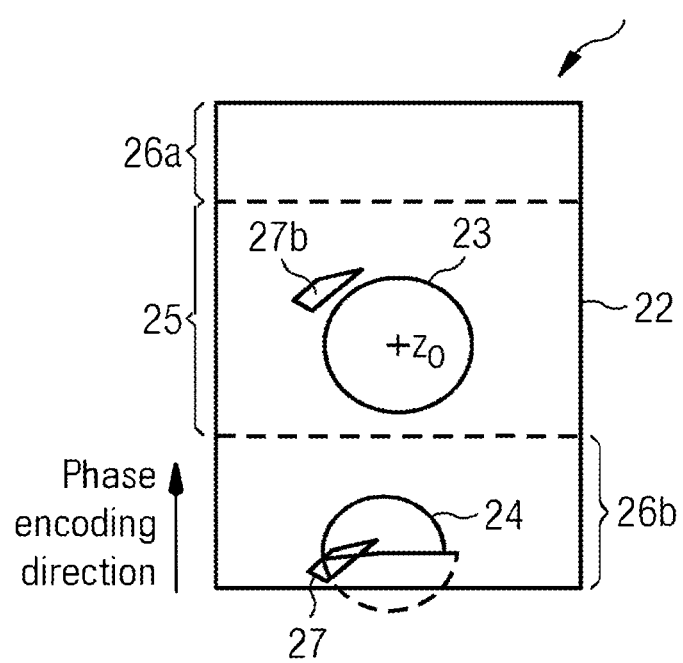

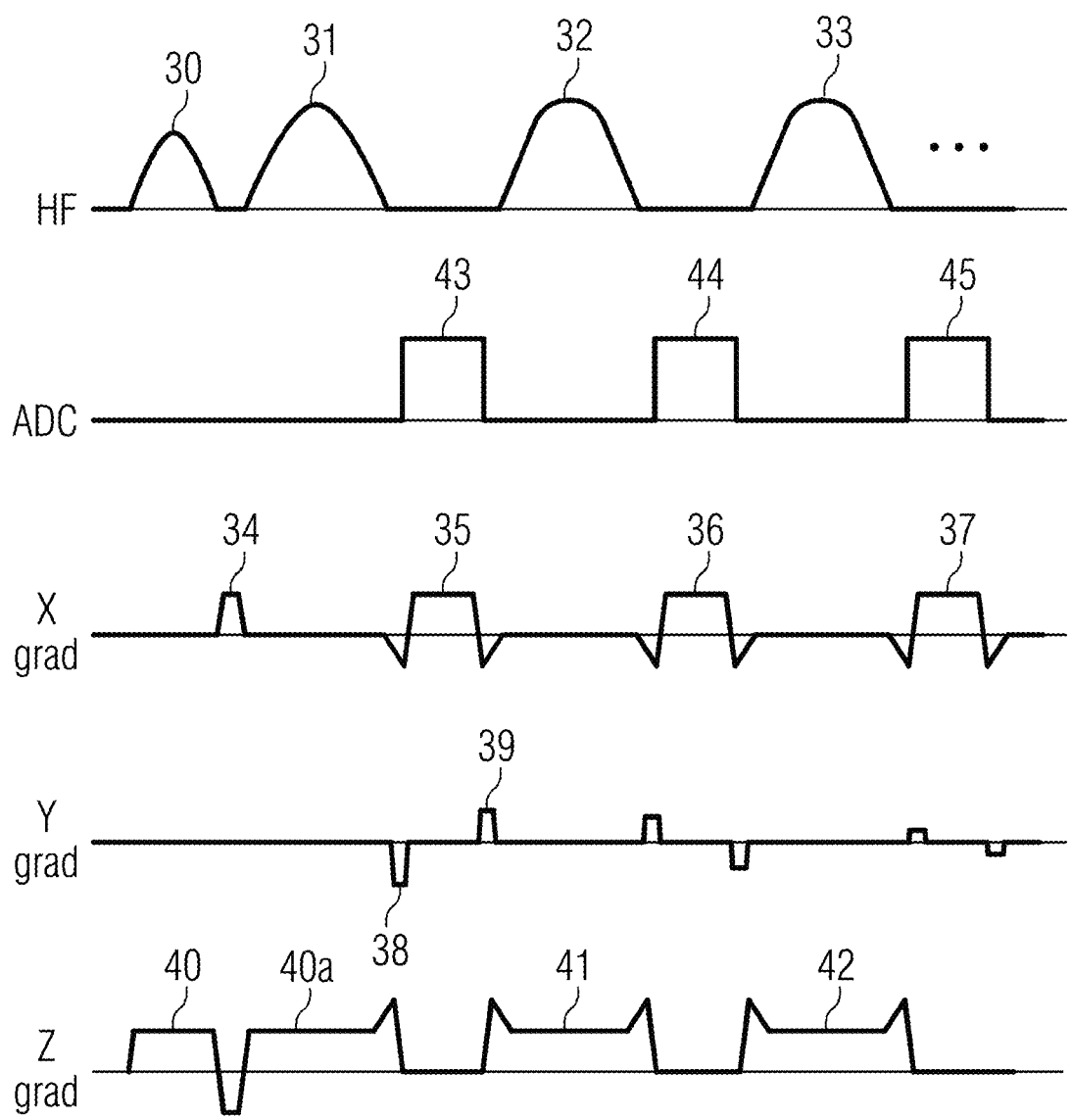

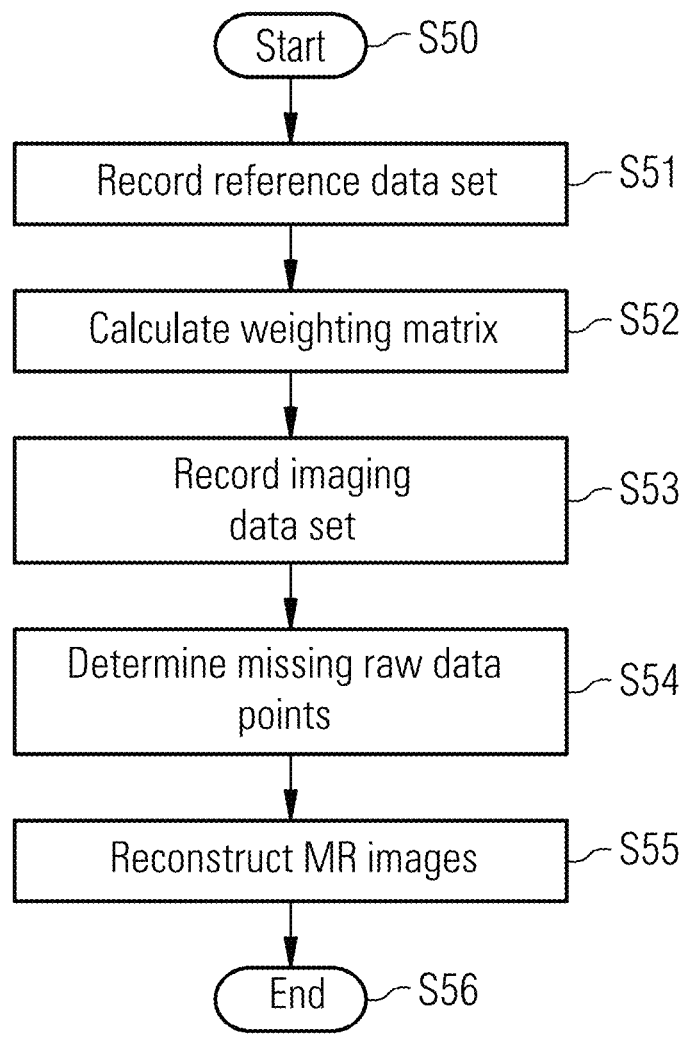

MAGNETIC RESONANCE APPARATUS AND METHOD FOR PARALLEL IMAGING WITH A REFERENCE DATA SET FOR DETERMINING THE WEIGHTING MATRIX

BACKGROUND OF THE INVENTION

Field of the Invention

The present invention concerns a method for generating magnetic resonance (MR) image data of an object under examination with parallel imaging, and an MR system and an electronically readable data storage medium that implement such a method.

Description of the Prior Art

MR systems having a cylindrical geometry have a reduced homogeneity of the constant magnetic field B0 and a reduced gradient linearity at the edges of the field of view in the bore direction, which is usually referred to as the z-axis. For coronary and sagittal recordings, this leads to compressed regions in the reconstructed images with high signal intensity in the regions at the edge of the bore, since the inhomogeneity of the gradient field and/or of the polarization field B0 means that a number of regions of the object under examination are mapped to a relatively small image region, which increases the signal intensity in this image region and conversely decreases the signal intensity in adjacent regions. This means that, as a result of the incorrect position encoding, both pixels with an increased signal intensity, and pixels with a reduced signal intensity, exist. These regions are generally located at the edge of the field of view (FOV) in the z-direction. Moreover, the use of parallel imaging techniques, such as GRAPPA, often results in artifacts occurring at integer multiples of the position FOVz/R in imaging sequences, where R is the acceleration factor. In parallel imaging, the missing unmeasured raw data areas are calculated with the use of a number of receive channels and their different coil sensitivities. The coil sensitivities are ascertained by reference measurements or calibration measurements. This procedure requires a good reference data set or calibration data set. If the latter is faulty, then the MR images calculated with parallel imaging are also faulty. The reason for the artifacts in parallel imaging is also that the imaging algorithms are usually not able to handle localized regions with very high signal intensity, which, as explained above, can occur at the edge of the MR system components. In parallel imaging in particular, this leads to the incomplete suppression of so-called aliasing artifacts in these regions.

This phenomenon is particularly prominent in spin echo sequences because dephasing plays a lesser role in such sequences on B0 inhomogeneities or gradient inhomogeneities, and does not lead to signal cancelation as in the case of gradient echo sequences. In addition, the intensity and form of the aforementioned artifacts are dependent on the recording parameters (such as gradient amplitudes, bandwidth of the RF pulses, reception bandwidth, and image resolution).

A further factor that can lead to the recording of a faulty calibration data set is the segmented recording of the calibration data. This means that the required k-space data are not recorded consecutively in a short time sequence but rather are recorded in segments over a longer period of time. This is the case when the data are obtained in the context of recording the imaging data. Physiological effects such as blood flow, liquor pulsation, heartbeat and respiration then lead to inconsistencies in the data recorded in segmented fashion, for example with regard to their phase position relative to one other.

One way of reducing these artifacts is to average the MR signals by recording the MR signals twice or multiple times. If the MR signals are recorded twice, this can take place once with recording (filling) of the even k-space lines and once with recording of the odd k-space lines. The central k-space lines of both recordings are then combined and used to calculate the reference data sets or calibration data sets. The artifacts in the final composite image are canceled out by such a method, but the measurement time is at least doubled, which is a significant disadvantage.

SUMMARY OF THE INVENTION

An object of the invention is to reduce the aforementioned disadvantages in order to improve parallel imaging such that fewer artifacts are present in the reconstructed image data.

In a method according to the invention for generating MR image data of an object under examination with parallel imaging, a reference data set of the object under examination is recorded, in which at least one partial section of the associated raw data space (k-space) is completely filled with raw data according to the Nyquist condition. Furthermore, an imaging data set for the generation of MR image data is recorded on the basis of spin-echo based signals, in which case the associated raw data space is not completely recorded according to the Nyquist condition. A weighting matrix is calculated on the basis of the reference data set, which is used to determine raw data points of the imaging data set that were not recorded during parallel imaging. The unrecorded raw data points of the imaging data set are calculated using the calculated weighting matrix. In this case, the reference data set is recorded with a spin-echo-based reference imaging sequence without segmentation of the recording data within an imaging slice and without temporal overlap with the recording of the imaging data set, and the resolution in the readout direction is lower by at least a factor of four than when the imaging data set is recorded.

Despite its name, the aforementioned imaging data set contains raw MR data, which are reconstructed into MR image data, and the reconstructed MR image data are displayed at a display monitor as an MR image of the examination subject. For this purpose, the completed raw data set, formed by applying the weighting matrix to the incomplete acquired raw data set, is made available as a data file, for storage and/or for implementing the aforementioned reconstruction.

The resolution in the readout direction can be reduced by using a temporally separated reference data set which does not overlap temporally with the recording of the imaging data set. This reduces the recording time for the reference data set and allows the imaging parameters for the reference data set to be selected independently of the parameters for creating the imaging data set. Preferably, the imaging data set is recorded in segmented fashion and entered into a number of recording regions within a number of imaging slices, in which case the reference data set is recorded for each of the multiple imaging slices. If the imaging for the creation of the MR image data is a multi-slice sequence, then the reference data set for the actual slice can be recorded before or after the recording of that slice.

For example, it is possible that the RF excitation pulse used in order to generate the spin echo when creating the imaging data set may have a different slice profile than the RF excitation pulse that is used when creating the reference data set. Similarly, the slice profile of the refocusing pulses that are used when creating the imaging data set may be different from that of the RF refocusing pulses that are used when creating the reference data set.

Furthermore, when creating the reference data set, RF refocusing pulses after a first RF refocusing pulse can be used in order to generate the spin echoes, which have a smaller flip angle than the corresponding RF refocusing pulses that occur after the first refocusing pulse when creating the imaging data set. The flip angles of the RF refocusing pulses after the first RF refocusing pulse can be between 20° and 120° in the case of the reference data set, preferably between 20° and 70°. As a result of the smaller flip angles, the recording time can be reduced in total because the time required for radiation by the RF pulses can be reduced. Furthermore, the radiated energy can be reduced by the smaller flip angles.

It is likewise possible when creating the reference data set to use RF excitation pulses and refocusing pulses whose spectral bandwidth is independent of the spectral bandwidth of the RF excitation pulses and refocusing pulses that are used when creating the imaging data set. For example, it is possible to select the spectral bandwidth the same in the case of the RF excitation pulse and the RF refocusing pulse in the case of the reference data set. This is not the case as a general rule when creating the imaging data set.

Furthermore, it is possible to select the RF pulses used when creating the reference data set such that they have an average reference duration that is shorter by a factor of at least 0.8 than the average duration of the RF pulses that are used when creating the imaging data set.

By means of the aforementioned capabilities of the inventive method, it is possible to record the reference data set in a very short time. This reference data set also has a good brightness and a homogeneous distribution of the signal over the entire image data space. It is thereby possible to accurately calculate the weighting matrix and the coil sensitivities for the individual receive coils. By separating the recording of the raw data set and the imaging data set, it is possible to create raw data sets that are better suited for the calibration of parallel imaging, since there is no need to take into account the parameters used of the imaging data set.

For example, the imaging data set can be a turbo spin echo Dixon sequence. In such a sequence, spin echoes of different tissue components at least have the same phase position once and an opposite phase position once. In the prior art it was usual to record the reference data set interleaved with the actual imaging data set. Particularly with a turbo spin echo Dixon sequence, this led to unsatisfactory results in the creation of the reference data set since the spacing of the refocusing pulses needs to be increased in order to fulfill the condition for opposing phase positions. If the reference data set is obtained from the data with the same phase position, the physiological effects described above become more noticeable. However, if it is ascertained from the data with the opposite phase position, the recording times are not located in the center between two pulses, which results in an additional dephasing of the spins in the marginal regions of the FOV, which has a negative effect on the calibration as described above.

The invention furthermore concerns an associated MR apparatus for creating the MR image data with the use of the reference data set and the weighting matrix described above. The MR apparatus has a control computer and a memory in which control information is stored that can be executed by the control computer in order to operate the scanner of the MR apparatus. The MR apparatus is designed to carry out the steps described above and also described in detail below when the control information is executed in the control computer.

The present invention also encompasses a non-transitory, computer-readable data storage medium encoded with programming instructions that, when the storage medium is loaded into a computer or computer system of a magnetic resonance apparatus, cause the computer or computer system to operate the MR apparatus in order to execute any or all embodiments of the method according to the invention, as described above.

The features described above and the features described below can be used not only in the correspondingly explicitly stated combinations but also in other combinations, unless explicitly stated otherwise. Furthermore, the various features described can be used individually.

BRIEF DESCRIPTION OF THE DRAWINGS

FIG. 2 schematically shows an example of an MR image in which an artifact occurs in a marginal region, which can be avoided with the MR system shown in FIG. 1.

FIG. 3 schematically shows a sequence for the creation of the reference data set, with which the artifacts of FIG. 2 are reduced.

FIG. 4 shows a flowchart of an exemplary embodiment of the inventive method with steps for improved recording of a reference data set, which enables an improved calculation of the weighting matrix.

DESCRIPTION OF THE PREFERRED EMBODIMENTS

Figure 1:
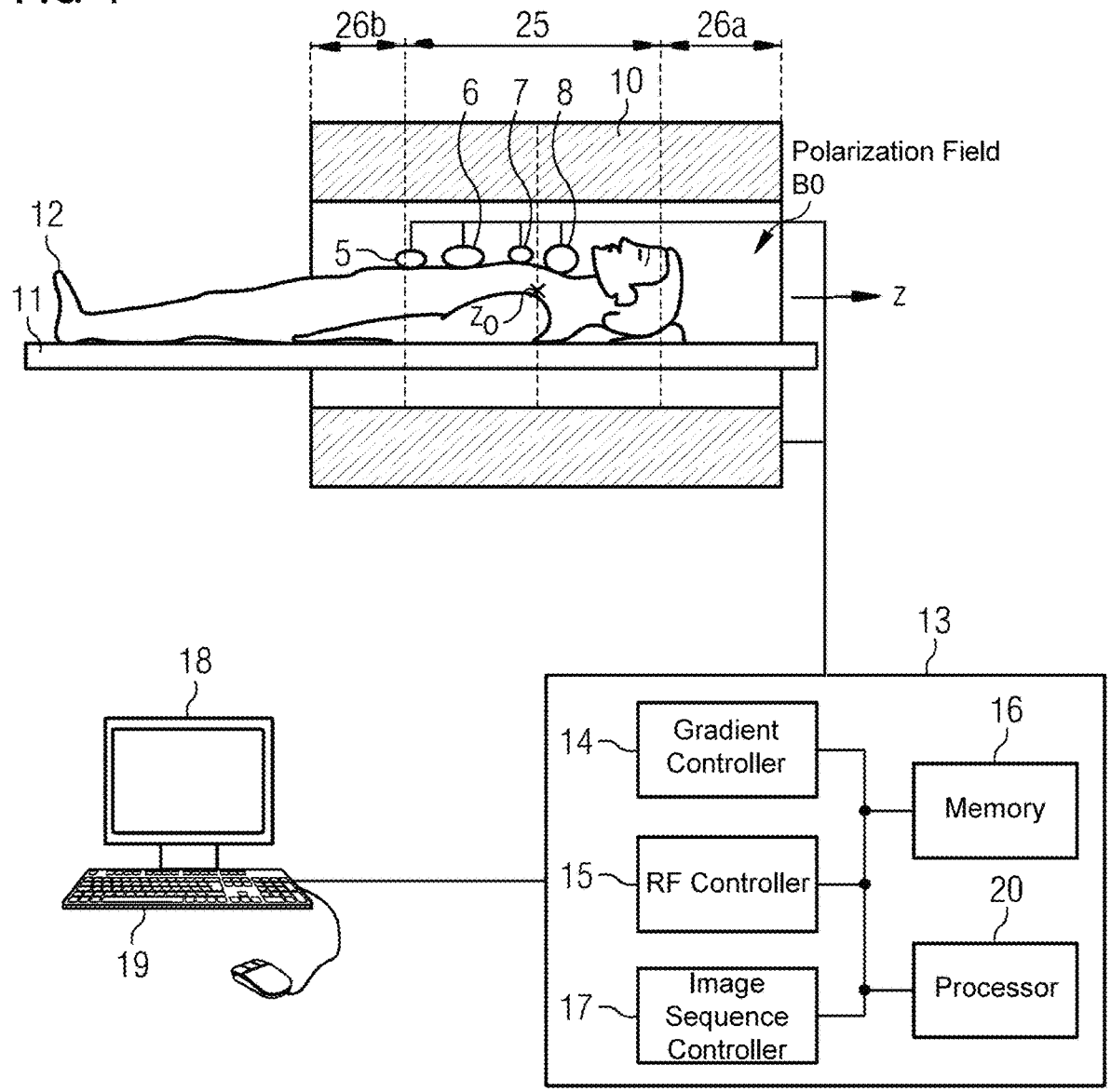
FIG. 1 schematically shows an MR apparatus with which, according to the invention, when implementing parallel imaging, artifacts can be reduced in the image calculation by an improved weighting matrix, which is calculated on the basis of a reference data set.

FIG. 1 schematically shows an MR system with which, according to the invention, artifacts in MR images can be reduced that are caused by an unsatisfactory reference data set being used during parallel imaging in order to calculate a weighting matrix, the so-called kernel. The magnetic resonance system has an MR data acquisition scanner with magnet 10 that generates a polarization field B0. A person under examination, on a patient bed 11, constitutes the object under examination 12, who is introduced into an isocenter Z0 of the magnet 10 in order to record spatially encoded magnetic resonance signals from the object under examination 12. As is explained in more detail below, the recording volume usually has a first recording region with a higher inhomogeneity of fields and a second recording region in which the homogeneity of the respective fields is better than in the first subregion. The polarization field B0 and/or the linearity of the magnetic field gradients that are generated by gradient coils (not shown) for the spatial encoding can be considered here as the relevant fields. By radiating with radio-frequency (RF) pulses and switching magnetic field gradients, the magnetization of certain nuclear spins in the object 12 generated by the polarization field B0 is deflected from the steady state and the signals emitted by those spins as they relax and return to the steady state are detected as currents induced in reception coils 5 to 8, as magnetic resonance signals. The general operation for the creation of MR images utilizing the detection of magnetic resonance signals, in particular with regard to parallel imaging using a weighting matrix for the generation of unrecorded raw data points, is known to those skilled in the art, so that a more detailed description is not necessary herein.

The magnetic resonance apparatus has a control computer 13 that operates the MR apparatus. The control computer 13 has a gradient controller 14 for controlling and switching the magnetic field gradients and an RF controller 15 for generating and controlling the RF pulses in order to deflect the nuclear spins from the steady state. The RF controller 15 is a multi-channel RF component, which generates RF pulses in a number of independent channels. A memory 16 stores the imaging sequences necessary for recording the MR images, as well as all other control information necessary to carry out the invention. An image sequence controller 17 controls the image recording (data acquisition) and thus, depending on the selected imaging sequences, the sequence of the magnetic field gradients, the RF pulses and the receive intervals of the MR signals. In this way, the image sequence controller 17 also controls the gradient controller 14 and the RF controller 15. MR images, which can be displayed on a display 18, are calculated (reconstructed) in a processor 20. An operator can control the MR system via an input unit 19. The processor 20 is used, inter alia, in order to calculate a weighting matrix, or the so-called kernel, such as the GRAPPA kernel, on the basis of a reference data set.

FIG. 2 schematically illustrates an MR image 22, which shows an MR image of a first object under examination 23 and a second object under examination 24. The object under examination 24 is positioned at the edge of the MR system in the phase encoding direction, in other words at the edge at which the homogeneity of the polarization field B0 is lower and at which the linearity of the magnetic field gradients is lower than in the region in which the object 23 is arranged. With regard to the embodiment shown in FIG. 2 it is assumed that the first object under examination 23 is essentially centered in the isocenter Z0 of the magnet. A first homogeneity of the polarization field B0 and of the magnetic field gradients is present in this second subregion 25 during image recording. Even after adjustment of all system components to the object under examination, called shimming, a first subregion 26a and 26b is present in which the magnetic field homogeneity and the gradient linearity are lower than in the second subregion. The first subregion can be defined by the fact that the relationship between the physical location in the MR system and the Larmor frequency of the spins deviates by 5%, 7% or 10% in each case from the nominal value which is a linear relationship between location and Larmor frequency when switching of gradients is taking place and is a constant value when gradients are switched off. Due to the increased inhomogeneity in the subregion 26a to 26b, here in the subregion of 26b, there is an increased placement of tissue in a single pixel for the object under examination 24. The phase encoding direction as shown in FIG. 2 is perpendicular to the division of the recording volume into the subregions. Artifacts 27 having a high signal intensity can result which are caused by the fact that a plurality of pixels are placed on a single point, in other words a single pixel in the MR image, during the reconstruction. As a result of incorrect calibration of the parallel imaging on account of the high signal intensity, said artifacts 27 can at least partially fold over into the field of view 25 as an additional artifact 27b and overlay the object 23 there, which can render the diagnosis more difficult. Such artifacts 27b can be reduced or prevented if the weighting matrix of the parallel imaging is calculated as explained in the following.

A detailed explanation is given in the following as to how a separately recorded reference data set with a low resolution, and the use of a multispin echo sequence for creating the reference data set, can provide data that can be used to calculate a good kernel or a good weighting matrix, which is then used in order to calculate missing raw data points during the parallel imaging. The MR images then created have fewer artifacts due to the improved reference data set.

The imaging sequence for the creation of the actual MR image data can be a turbo spin echo Dixon imaging sequence. With this Dixon technique, the tissue components recorded in the object under examination have the same phase position once and the opposite phase position once. The MR images are recorded in a number of segments, which means that only a part of the raw data space is recorded (filled) per segment. Furthermore, the imaging sequence for creating the actual MR images is a multi-slice sequence. For each slice of the multi-slice sequence, the imaging sequence shown in FIG. 3 can be used in order to generate the reference data set.

The sequence has an RF excitation pulse 30 and a number of refocusing pulses 31, 32 and 33. In particular, the refocusing pulses 32 and 33 and all subsequent refocusing pulses can be chosen in such a manner that very small refocusing angles are used, for example between 20° and 120°, preferably between 20° and 80°, further preferably between 20° and 60°. Simultaneously with the excitation pulses, the slice selection gradients 40, 40a, 41 and 42 are switched in the slice selection direction, the Z direction of FIG. 3, as they are usually used in spin echo sequences. In the phase encoding direction, the gradients 38 and 39 as well as other gradients having different strengths are used for phase encoding and the signal echoes generated by the refocusing pulses are read out during the readout gradients 34, 35-37. This is illustrated schematically by the ADC 43, 44 and 45. The imaging sequence used to generate the reference data set differs here from the imaging sequence which is used for creating the imaging data set. Thus it is possible that the excitation pulse 30 and the refocusing pulses 31, 32 or 33 have the same bandwidth. This is usually not the case with the RF pulses of the imaging sequence used to create the imaging data set. As a result of the higher bandwidth and the smaller flip angles, shorter durations can be used for the irradiation by the excitation and refocusing pulses. Thus for example, the average duration which is used for the excitation pulses and refocusing pulses is shorter by a factor of 0.6, 0.7 or 0.8 than the corresponding average duration which occurs with the excitation pulses and refocusing pulses of the imaging sequence for creating the imaging data set. In addition, the resolution in the readout direction is lower by a factor of 4 to 10 than during the creation of the imaging data set. Furthermore, different slice profiles can be used for the RF excitation pulses and refocusing pulses than for the associated RF excitation pulses and refocusing pulses used for creating the imaging data set. A precisely rectangular slice profile is not required for the reference data set, which in turn means that the recording time overall can be shortened by using other slice profiles which place less emphasis on a rectangular slice profile. The sensitivity of the reference data set to aliasing artifacts from the marginal region of the FOV is reduced by the above-mentioned measures.

Preferably, the slice position for the generation of the MR images and thus of the reference data set is located in the coronary or sagittal direction, where inhomogeneities occur at the edges due to the geometry of the MR system. The invention, however, can also be used for transverse slice positioning.

By using the reference data set described above, said reference data set can be recorded in total in a very short period of time, which means that the total time for recording the imaging data set is likewise reduced. The reference data generated by the reference data imaging sequence of FIG. 3 have a high degree of homogeneity in the image data space. This makes it possible to calculate the weighting kernel more accurately with this reference data set than with a reference data set integrated in the imaging set, which is used in order to subsequently reconstruct the unrecorded raw data points in parallel imaging, recorded with the aid of GRAPPA or SENSE techniques. How the weighting matrix is calculated from the reference data set is known to those skilled in the art and thus need not be explained in detail herein. The RF pulses used in the creation of the reference data set furthermore have the advantage that they result in very low RF loads on the person under examination.

FIG. 4 summarizes the steps which enable missing raw data points to be calculated in parallel imaging, wherein the reference data set is recorded as explained in FIG. 3 in order to create a homogeneous reference data set which forms a good basis for calculating the weighting matrix for determining the missing raw data points. The method starts in a step S51 and the reference data set is recorded in a step S52, as explained above in connection with FIG. 3. In this case, the reference data set is recorded for each imaging slice of an imaging data set. The recording of the individual slices is preferably carried out such that the data for a first slice are first recorded in their entirety. Subsequently, the data of a second slice are recorded in their entirety. The second slice can be directly adjacent to the first slice or can be located at a different position in the slice package, for example in the third position. When all the slices of the slice package have been recorded, the weighting matrix can subsequently be calculated for each slice, which then forms the basis for calculating the missing raw data points (step 52). The imaging data set is then recorded in a step S53. The recording of the imaging data set takes place in segmented fashion as a general rule. In this regard a first set of k-space lines is first recorded from a first slice, for example every eighth k-space line of the raw data matrix. Subsequently, every eighth k-space line of a second slice is recorded, etc. When this first number of k-space lines has been recorded for every slice, a second pass of the entire slice package takes place after the repetition time TR. Here, a second set of k-space lines of the raw data matrix is recorded for each slice. The process is repeated until all necessary k-space lines have been recorded. The missing raw data points are then determined in step S54 with the use of the weighting matrix and with the use of the raw data points recorded in step S53. Furthermore, in step S55 the MR images of the imaging data set are reconstructed. The reconstructed MR images have fewer artifacts and overall the recording time is reduced because the recording time for the creation of the reference data set can be reduced.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating MR image data of an object under examination with parallel imaging, the method comprising:

from a control computer, recording a reference data set of the object under examination, the recording of the reference data set completely filling at least one partial section of raw data space for the reference data set;

from the control computer, recording an imaging data set of the object under examination using spin echoes of a spin-echo based imaging sequence for the generation of the MR image data, the recording of the imaging data set not completely filling raw data space for the imaging data set, the raw data space for the imaging data set including unrecorded raw data points;

in the control computer, calculating a weighting matrix from the reference data set, and calculating values for the unrecorded raw data points using the weighting matrix;

wherein the reference data set is recorded with spin echoes of a spin-echo-based reference imaging sequence without segmentation within an imaging slice and without temporal overlap with the recording of the imaging data set, and the reference data set having a resolution that is lower by at least a factor of 4 than a resolution of the imaging data set, and wherein the spin echoes of the spin-echo-based reference imaging sequence are generated using a first reference RF refocusing pulse and second reference RF refocusing pulses that occur after the first reference RF refocusing pulse, wherein the spin echoes of the spin-echo-based imaging sequence are generated using a first imaging RF refocusing pulse and second imaging RF refocusing pulses that occur after the first imaging RF refocusing pulse, and wherein each of the second reference RF refocusing pulses have a smaller flip angle than a flip angle of each corresponding one of the second imaging RF refocusing pulses.

2. A method as claimed in claim 1, wherein the imaging data set is recorded using a segmented recording procedure in a plurality of imaging slices of the object under examination, and wherein the reference data set is recorded for each of the plurality of imaging slices.

3. A method as claimed in claim 1, wherein:

an RF excitation pulse is used to generate the spin echoes of the spin-echo based imaging sequence, an RF excitation pulse is further used to generate the spin echoes of the spin-echo based reference imaging sequence, and the RF excitation pulse of the spin-echo based imaging sequence has a different slice profile from the RF excitation pulse of the reference data set.

4. A method as claimed in claim 1, wherein the first imaging RF refocusing pulse and each of the second imaging RF refocusing pulses have a different slice profile than the first reference RF refocusing pulse and each of the second reference RF refocusing pulses.

5. A method as claimed in claim 1, wherein each of the flip angles of the second reference RF refocusing pulses are in a range between 20° and 120°.

6. A method as claimed in claim 1, wherein:

a reference RF excitation pulse is used with the first reference RF refocusing pulse and each of the second reference RF refocusing pulses to generate the spin echoes of the spin-echo based reference imaging sequence for recording the reference data set, a imaging RF excitation pulse is used with the first imaging RF refocusing pulse and each of the second imaging RF refocusing pulses are used to generate the spin echoes of the spin-echo based imaging sequence for recording the imaging data set, and the reference RF excitation pulse, the first reference RF refocusing pulse, and each of the second reference RF refocusing pulses have a spectral bandwidth that is selected independently of a spectral bandwidth selected for the imaging RF excitation pulse, the first imaging RF refocusing pulse, and each of the second imaging RF refocusing pulses.

7. A method as claimed in claim 6, wherein the spectral bandwidth for the reference RF excitation pulse, the first reference RF refocusing pulse, and each of the second reference RF refocusing pulses is the same.

8. A method as claimed in claim 1, wherein:

the first reference RF refocusing pulse and each of the second reference RF refocusing pulses have an average reference duration that is shorter by a factor of at least 0.8 than an average duration of the first imaging RF refocusing pulse and each of the second imaging RF refocusing pulses.

9. A method as claimed in claim 1, wherein the spin-echo based imaging sequence for recording the imaging data set is a turbo spin-echo Dixon sequence in which spin echoes of different tissue components of the object under examination have a same phase position at least once, and an opposite phase position at least once.

10. A magnetic resonance (MR) system to generate MR image data of an object under examination with parallel imaging, the MR system comprising:

a control computer; and a memory configured to store control information that can be executed by the control computer to cause the MR system to:

record a reference data set of the object under examination, the recording of the reference data set completely filling at least one partial section of raw data space for the reference data set;

record an imaging data set of the object under examination using spin echoes of a spin-echo-based imaging sequence for the generation of the MR image data, the recoding of the imaging data set not completely filling raw data space for the imaging data set, the raw data space for the imaging data set including unrecorded raw data points; and calculate a weighting matrix from the reference data set, and the calculating values for the unrecorded raw data points using the weighting matrix;

wherein the reference data set is recorded with spin echoes of a spin-echo-based reference imaging sequence without segmentation within an imaging slice and without temporal overlap with the recording of the imaging data set, and the reference data set having a resolution that is lower by at least a factor of 4 than a resolution of the imaging data set, and wherein the spin echoes of the spin-echo-based reference imaging sequence are generated using a first reference RF refocusing pulse and second reference RF refocusing pulses that occur after the first reference RF refocusing pulse, wherein the spin echoes of the spin-echo-based imaging sequence are generated using a first imaging RF refocusing pulse and second imaging RF refocusing pulses that occur after the first imaging RF refocusing pulse, and wherein each of the second reference RF refocusing pulses have a smaller flip angle than a flip angle of each corresponding one of the second imaging RF refocusing pulses.

11. A non-transitory, computer-readable data storage medium encoded with programming instructions, the storage medium being loaded into a control computer of a magnetic resonance (MR) apparatus, the programming instructions causing the MR apparatus generate MR image data of an object under examination with parallel imaging, by:

recording a reference data set from an object under examination, the recording of the reference data set completely filling at least one partial section of raw data space for the reference data set;

recording an imaging data set of the object under examination using spin echoes of a spin-echo-based imaging sequence for the generation of the MR image data, the recording of the imaging data set not completely filling raw data space for the imaging data set, the raw data space for the imaging data set including unrecorded raw data points;

calculating a weighting matrix from the reference data set, and calculating values for the unrecorded raw data points using the weighting matrix;

wherein the reference data set is recorded with spin echoes of a spin-echo-based reference imaging sequence without segmentation within an imaging slice and without temporal overlap with the recording of the imaging data set, and the reference data set having a resolution that is lower by at least a factor of 4 than a resolution of the imaging data set, and wherein the spin echoes of the spin-echo-based reference imaging sequence are generated using a first reference RF refocusing pulse and second reference RF refocusing pulses that occur after the first reference RF refocusing pulse, wherein the spin echoes of the spin-echo-based imaging sequence are generated using a first imaging RF refocusing pulse and second imaging RF refocusing pulses that occur after the first imaging RF refocusing pulse, and wherein each of the second reference RF refocusing pulses have a smaller flip angle than a flip angle of each corresponding one of the second imaging RF refocusing pulses.

* * * * *